US009935040B2

(12) United States Patent
Fushie et al.

(10) Patent No.: US 9,935,040 B2
(45) Date of Patent: Apr. 3, 2018

(54) SEMICONDUCTOR MODULE

(71) Applicant: Mitsubishi Electric Corporation, Tokyo (JP)

(72) Inventors: Shunsuke Fushie, Tokyo (JP); Yu Kawano, Tokyo (JP); Yoshihito Asao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/124,809

(22) PCT Filed: May 9, 2014

(86) PCT No.: PCT/JP2014/062469
§ 371 (c)(1),
(2) Date: Sep. 9, 2016

(87) PCT Pub. No.: WO2015/170399
PCT Pub. Date: Nov. 12, 2015

(65) Prior Publication Data
US 2017/0018486 A1    Jan. 19, 2017

(51) Int. Cl.
*H01L 23/495* (2006.01)
*H01L 23/00* (2006.01)
(Continued)

(52) U.S. Cl.
CPC .... *H01L 23/49562* (2013.01); *H01L 21/4825* (2013.01); *H01L 21/565* (2013.01);
(Continued)

(58) Field of Classification Search
CPC ......... H01L 23/49555; H01L 23/49541; H01L 2224/26175; H01L 23/49503
(Continued)

(56) References Cited

U.S. PATENT DOCUMENTS 5,367,124 A * 11/1994 Hoffman ............... B23K 1/0016
174/529
5,844,306 A * 12/1998 Fujita ................. H01L 23/49503
257/666

(Continued)

FOREIGN PATENT DOCUMENTS

DE     248906 A1    8/1987
EP    2637285 A1    9/2013
(Continued)

OTHER PUBLICATIONS

International Search Report for PCT/JP2014/062469 dated Aug. 19, 2014.
(Continued)

*Primary Examiner* — S. V. Clark
(74) *Attorney, Agent, or Firm* — Sughrue Mion, PLLC; Richard C. Turner

(57) ABSTRACT

A semiconductor module can be realized, which is formed by mounting an electronic component and a bus bar by solder on a lead frame including a plurality of terminals, wherein a solder flow suppressing section capable of restricting a direction of flow of solder on the lead frame is formed in the vicinity of the solder portion of the component mounted by solder, and by this configuration, positional deviation, such as rotation or movement of the mounted component, is suppressed and the size of the module can be made compact.

19 Claims, 8 Drawing Sheets

(51) Int. Cl.
  *H01L 21/48* (2006.01)
  *H01L 21/56* (2006.01)
  *H01L 23/31* (2006.01)
  *H02M 7/537* (2006.01)
  *H02M 7/00* (2006.01)

(52) U.S. Cl.
  CPC ........ *H01L 23/3114* (2013.01); *H01L 23/495* (2013.01); *H01L 23/4952* (2013.01); *H01L 23/49513* (2013.01); *H01L 23/49524* (2013.01); *H01L 23/49541* (2013.01); *H01L 23/49548* (2013.01); *H01L 23/49575* (2013.01); *H01L 24/40* (2013.01); *H02M 7/537* (2013.01); *H01L 2224/40139* (2013.01); *H01L 2224/40245* (2013.01); *H01L 2224/48247* (2013.01); *H01L 2224/73221* (2013.01); *H01L 2924/13055* (2013.01); *H01L 2924/13091* (2013.01); *H02M 7/003* (2013.01)

(58) Field of Classification Search
  USPC .................................................. 257/666, 676
  See application file for complete search history.

(56) References Cited

U.S. PATENT DOCUMENTS

| | | | | |
|---|---|---|---|---|
| 5,847,446 A | * | 12/1998 | Park | H01L 23/49503 257/666 |
| 6,081,029 A | * | 6/2000 | Yamaguchi | H01L 21/561 257/666 |
| 6,744,119 B2 | * | 6/2004 | Kuo | H01L 23/49503 257/666 |
| 8,354,303 B2 | * | 1/2013 | Lopez | H01L 23/49537 257/E21.506 |
| 2007/0001273 A1 | | 1/2007 | Sato et al. | |
| 2008/0017958 A1 | * | 1/2008 | Wu | H01L 23/4951 257/666 |
| 2010/0078802 A1 | * | 4/2010 | Pan | H01L 23/49531 257/692 |
| 2011/0285226 A1 | | 11/2011 | Fujita et al. | |
| 2012/0248588 A1 | | 10/2012 | Yamabe | |

FOREIGN PATENT DOCUMENTS

| | | |
|---|---|---|
| JP | 9-283687 A | 10/1997 |
| JP | 2007-012857 A | 1/2007 |
| JP | 2008-270290 A | 11/2008 |
| JP | 2009-302101 A | 12/2009 |
| JP | 2011-250491 A | 12/2011 |

OTHER PUBLICATIONS

Communication dated Nov. 8, 2017, issued by the European Patent Office in counterpart Application No. 14891180.3.

* cited by examiner

SEMICONDUCTOR MODULE

CROSS REFERENCE TO RELATED APPLICATIONS

This application is a National Stage of International Application No. PCT/JP2014/062469 filed May 9, 2014, the contents of all of which are incorporated herein by reference in their entirety.

TECHNICAL FIELD

The present invention relates to a semiconductor module in which a plurality of semiconductor elements are mounted on a lead frame, and more particularly to the compactification of such a module.

BACKGROUND ART

In recent years, semiconductor packages having high insulating properties and good heat radiating properties have become required in semiconductor modules that are provided with a power semiconductor element, such as an IGBT (Insulated Gate Bipolar Transistor), power MOSFET, and the like. Moreover, in semiconductor modules of this kind, progress has been made in compactification and increased mounting density. For example, there is a semiconductor module that can be made more compact by integrating the plurality of terminals and reducing the number of terminals, (see, for example, PTL 1).

CITATION LIST

Patent Literature

[PTL 1]
Japanese Patent Application Publication No. 2011-250491

SUMMARY OF INVENTION

Technical Problem

However, the prior art involves the following problems.
The semiconductor module proposed in PTL 1 has a large amount of space on the terminals where elements are not installed and there is still margin for further compactification by raising the element mounting ratio. Moreover, by compactifying the semiconductor module, increase in the yield of the lead frame can also be achieved.

The present invention was devised in order to resolve the problem described above, an object thereof being to obtain a semiconductor module which can achieve efficient use of a lead frame, as well as make the module more compact in size.

Solution to Problem

The semiconductor module according to the present invention is a semiconductor module formed by mounting an electronic component and a bus bar by soldering onto a lead frame including a plurality of terminals; wherein on the lead frame a solder flow suppressing section capable of restricting a direction of flow of solder is formed in the vicinity of the solder portion of the component mounted by solder thereon.

Advantageous Effects of Invention

According to the present invention, by restricting the direction of flow of solder by forming a solder flow suppressing section based on an uneven shape, a notch or a hole in the lead frame, and thereby suppressing positional deviation, such as rotation and movement of the mounted component, it is possible to obtain a semiconductor module which makes effective use of the lead frame, and makes the size of the module more compact.

DESCRIPTION OF EMBODIMENTS

Figure 1:
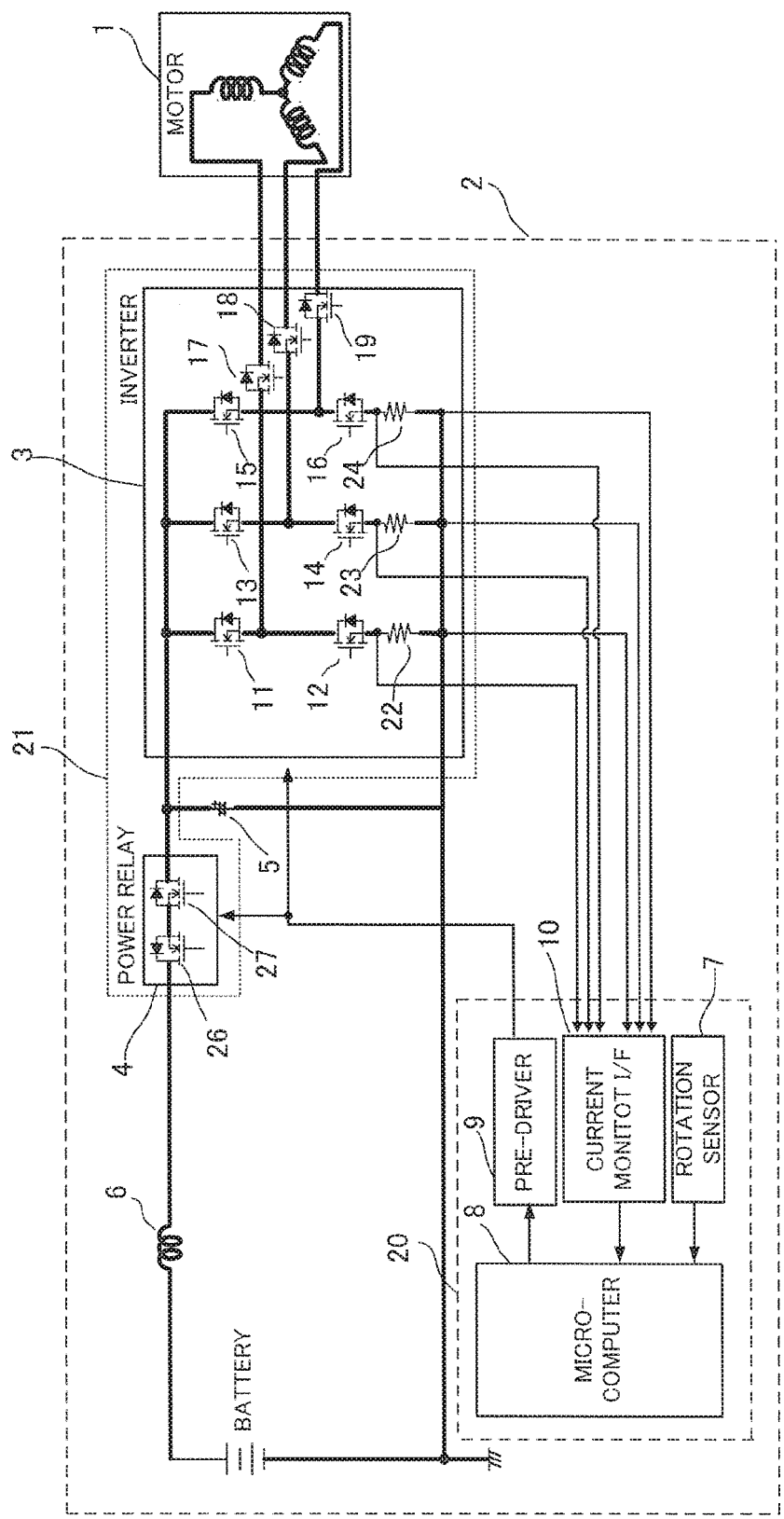
FIG. 1 is a general circuit diagram showing a power steering device mounted in a vehicle, as an example of a device to which the semiconductor module according to a first embodiment is applied.

A semiconductor module according to the present invention is described below with reference to the drawings. Parts which are the same or equivalent in the drawings are labelled with the same reference numerals.

First Embodiment

FIG. 1 is a general circuit diagram showing a power steering device mounted in a vehicle, as an example of a device to which the semiconductor module according to the first embodiment is applied. This device is constituted by a motor 1 and a control unit 2, which are both integrated into a single body.

The control unit 2 is constituted by a control circuit unit 20 configured by a microcomputer 8 and peripheral circuits, and a power circuit unit 3 provided with a power relay 4 and an inverter which supplies electric power to a motor coil.

The control unit 2 receives input of various information on a battery, vehicle speed sensor, and torque sensor source, calculates a steering wheel assist amount by the microcomputer 8, and outputs same to the inverter 3 via a pre-driver 9. Furthermore, a rotation sensor I/F which transmits a signal from the rotation sensor 7 that detects rotation of the motor 1, and a current monitor I/F 10 which measures the current supplied to the motor 1, are connected to the microcomputer.

The power source unit operates by receiving power from the battery, and is configured from a choke coil 6 for controlling noise, a smoothing capacitor 5, and a relay 4 which connects and disconnects the power line; the power source unit supplies power to the inverter 3. The inverter 3 is provided with a total of six upper/lower arm switching elements 11 to 16, in three sets corresponding to the three-phase coils of the motor 1. Moreover, switching elements 17 to 19 which serve as a relay capable of connecting and disconnecting the supply of power to the motor 1 are arranged respectively for each phase.

These switching elements (11 to 16, 17 to 19) are provided so as to correspond to each coil, and therefore are assigned the suffixes u, v and w. Furthermore, terminals Gh, Gl, Gm for controlling the switching elements are connected respectively to the microcomputer 8 via the pre-driver 9.

Moreover, there are three terminals Mm for voltage monitoring between the switching elements 11 to 16 of the upper and lower arms, and upstream monitor terminals of shunt resistances 22, 23, 24 for current detection. These monitor values are transmitted to the microcomputer 8 via a current monitor I/F 10. Apart from this, there are also coil terminals Mu, Mv, Mw for each phase in the motor 1.

The inverter 3 is configured from three semiconductor modules, a U-phase semiconductor module, a V-phase semiconductor module and a W-phase semiconductor module, which incorporate a plurality of switching elements. These semiconductor modules each incorporate a plurality of switching elements, and therefore also incorporate a plurality of circuits connecting the components, and have a large number of terminals. Furthermore, the current for supplying power to the motor 1 is also large, and hence there is a need to improve heat radiating properties. Consequently, the semiconductor module is an important component in the device, from the viewpoint of scale, quality, cost, and so on.

Figure 2:
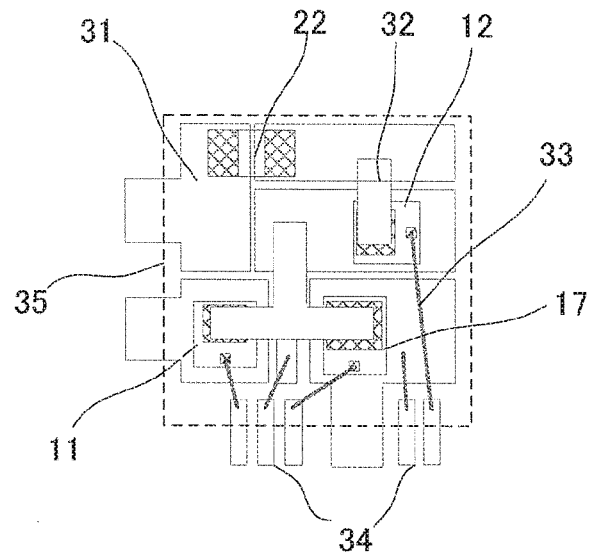
FIG. 2 is a perspective diagram of a half-completed state of a conventional U-phase semiconductor module.

Next, the structure of the semiconductor module will be described with reference to FIG. 2 onwards. In particular, in the following description, a detailed explanation is given using the U-phase semiconductor module. Firstly, a conventional semiconductor module will be described with reference to FIG. 2. FIG. 2 is a perspective diagram of a half-completed state of a conventional U-phase semiconductor module.

Here, the U-phase semiconductor module is a component which drives the U phase of the inverter 3. The U-phase semiconductor module has a structure in which a U-phase upper-side FET 11, a U-phase lower-side FET 12, a U-phase motor relay FET 17, a shunt resistance 22, and a lead frame 31 on which an inner lead 32 is mounted are molded by sealed resin. The V-phase semiconductor module and the W-phase semiconductor module have the same structure. Below, each part of the interior of the semiconductor module is described in detail.

The lead frame 31 is manufactured from a copper or iron alloy material, by applying a pressing, etching or cutting process to a single metal sheet material, which is stretched without any overlap between respective parts thereof. The pressing, etching and cutting processes have the merits of, respectively, high productivity, short turnaround, and low cost.

As shown in FIG. 2, for example, three U-phase FETs 11, 12, 17 are mounted respectively as semiconductor chips on a die pad. Connection between the semiconductor chips or connection between lead frames 31 are implemented by an inner lead 32 made of copper or iron material. This inner lead 32 is formed so as to span across the tops of the lead frames 31. Furthermore, a plurality of terminals protrude downwards in FIG. 2, as external terminals 34.

Next, the method of manufacturing the semiconductor module illustrated in FIG. 2 will be described.

(Step 1) A lead frame 31 on which semiconductor elements, electronic components, and the like, are mounted is placed inside the cavity of a molding die. In this case, the lead frame 31 is fixed in position by fixed pins or movable pins on the die.

(Step 2) Thereupon, the molding die is closed, and a sealing resin 30 is formed by filling the cavity with a thermally-curable resin, such as epoxy resin.

(Step 3) Furthermore, after the sealing resin 30 has been aged and cured, finally, the unwanted region of the lead frame 31 is cut and punched out to complete the semiconductor module.

Rather than covering all parts with sealing resin 30, it is also possible to form an outer frame, and then cover the center thereof with silicone resin.

Figure 3:
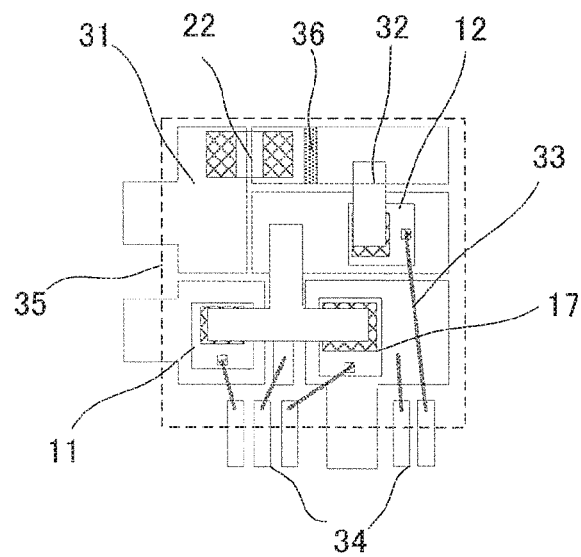
FIG. 3 is a perspective drawing of a half-completed state of a U-phase semiconductor module to which the solder flow suppressing section according to the first embodiment of the present invention has been applied.

Next, a solder flow suppressing section, which is the main essence of the present invention will be described. The solder flow suppressing section according to the present invention has a technical characteristic of suppressing positional deviation, such as rotation and movement of mounted components, by controlling (restricting) the solder flow direction on the lead frame. FIG. 3 is a perspective drawing of a half-completed state of a U-phase semiconductor module to which the solder flow suppressing section according to the first embodiment of the present invention has been applied. Furthermore, FIG. 4 is a cross-sectional diagram of a half-completed state of a U-phase semiconductor module to which the solder flow suppressing section according to the first embodiment of the present invention has been applied, and is also a diagram for description of the solder flow suppressing section shown in FIG. 3.

Figure 4:
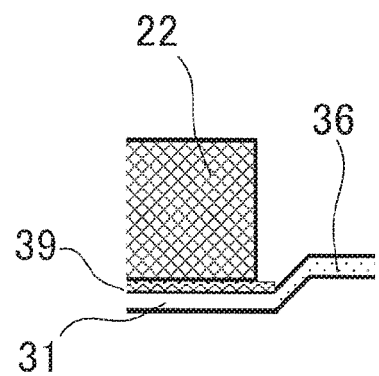
FIG. 4 is a cross-sectional drawing of a half-completed state of a U-phase semiconductor module to which the solder flow suppressing section according to the first embodiment of the present invention has been applied.

As shown in FIG. 3 and FIG. 4, in the first embodiment, a solder flow suppressing section having a projection shape 36 (uneven shape 36) is provided on the lead frame 31. FIG. 3 and FIG. 4 show examples of a case in which positional deviation, such as rotation and movement, of the shunt resistance 22 is suppressed.

Figure 5:
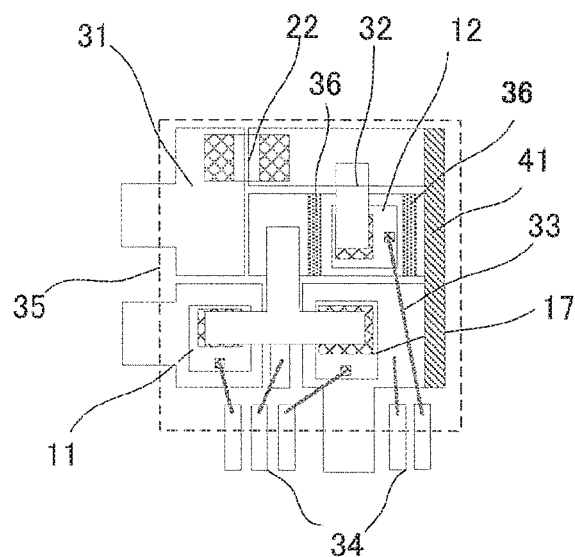
FIG. 5 is a perspective drawing of a half-completed state of a U-phase semiconductor module to which a solder flow suppressing section at a different position to that in FIG. 3 according to the first embodiment of the present invention has been applied.

On the other hand, FIG. 5 is a perspective diagram of a half-completed state of a U-phase semiconductor module to which the solder flow suppressing section according to the first embodiment of the present invention has been applied, and illustrates an example in which a projection shape 36, which is a solder flow suppressing section, is provided in a different position to FIG. 3 which was described above. In FIG. 5, in order to suppress positional deviation of the FET 12, a projection shape 36 is provided on both sides where the FET 12 is mounted.

By forming a positional deviation suppressing section of this kind on the lead frame 31, it is possible to suppress interference between the component mounted near the positional deviation suppressing section and other mounted components. Moreover, by suppressing positional deviation of the FET 12 as shown in FIG. 15, it is also possible to suppress secondary errors such as error in the mounting of the inner lead 32, or disconnection of the wire bonding 33. Moreover, since the accuracy of the mounting positions of the components on the lead frame 31 is improved, then it is possible to mount components on the lead frame 31 with greater density than conventionally, and hence the semiconductor module can be compactified.

According to the first embodiment as described above, components are mounted by using a lead frame in which a positional deviation suppressing section having a projection shape is provided at a suitable position. By providing a positional deviation suppressing section of this kind, it is possible to effectively suppress the flow of solder in between a component mounted near the positional deviation suppressing section, and other mounted components. As a result of this, it is possible to improve the accuracy of the mounting positions of mounted components on the lead frame, and it is possible to obtain a semiconductor module which achieves higher mounting density and a more compact size.

Furthermore, since the semiconductor module can be compactified, then it is possible to make the lead frame itself more compact, and the yield can be improved. Moreover, by improving the mounting accuracy, the occurrence of defective products during manufacture can be reduced.

Second Embodiment

In the first embodiment described above, a case is described in which a projection shape 36 is formed on the lead frame 31 as a positional deviation suppressing section. On the other hand, in the second embodiment, a case is described in which the solder flow suppressing section provided on the lead frame 31 is achieved by a structure that is not a projection shape 36. Therefore, below, the description centers on the changed portion associated with this difference, and the description of the configuration that is the same as the semiconductor module described above is omitted.

The projection shape 36 used in the first embodiment has a bending radius R, which thus narrows the possible component mounting region on the lead frame 31. Therefore, the second embodiment describes a solder flow suppressing section which makes it possible to broaden the possible component mounting region compared to the first embodiment, and which enables further compactification of the semiconductor module.

Figure 6:
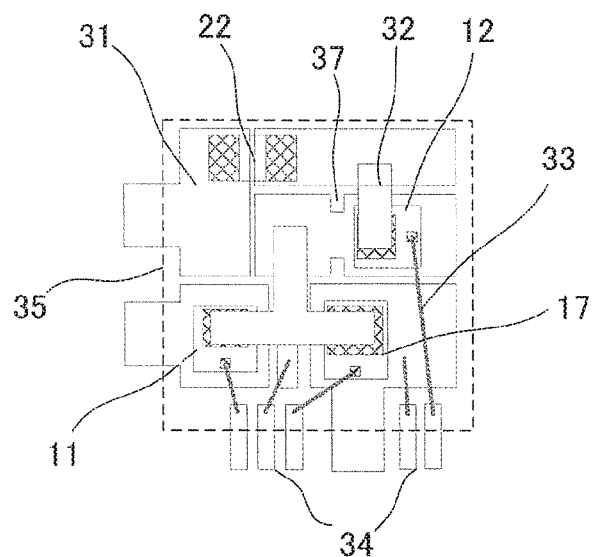
FIG. 6 is a perspective drawing of a half-completed state of a U-phase semiconductor module to which the solder flow suppressing section according to a second embodiment of the present invention has been applied.
Figure 7:
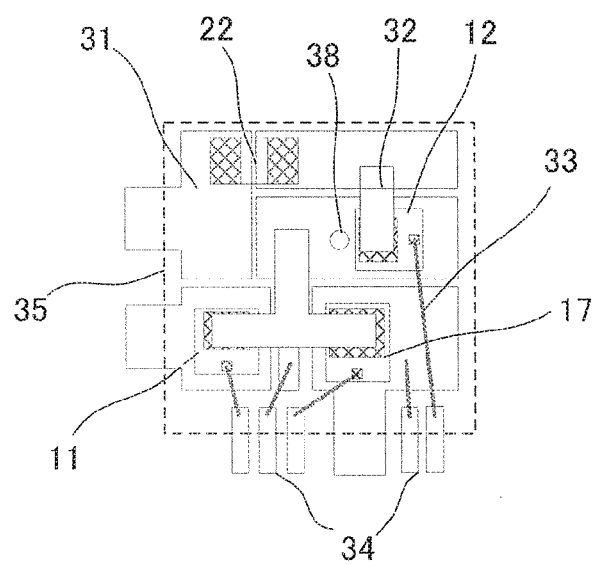
FIG. 7 is a perspective drawing of a half-completed state of a U-phase semiconductor module to which a solder flow suppressing section which is different to that in FIG. 6 according to the second embodiment of the present invention has been applied.

FIG. 6 is a perspective drawing of a half-completed state of a U-phase semiconductor module to which the solder flow suppressing section according to the second embodiment of the present invention has been applied. Furthermore, FIG. 7 is a perspective drawing of a half-completed state of a U-phase semiconductor module to which a solder flow suppressing section which is different to that in FIG. 6 according to the second embodiment of the present invention has been applied.

In the present embodiment, a notch 37 (FIG. 6) or a hole 38 (FIG. 7) is used as the solder flow suppressing section. Moreover, flow of solder is suppressed by directing the machining burr of the notch 37 or hole 38 of the lead frame 31, towards the component mounting surface.

In this way, the solder flow suppressing section according to the second embodiment is formed on the lead frame 31 as a notch 37 or a hole 38. Consequently, compared to a case where a projection shape 36 is formed as in the first embodiment, it is possible to suppress positional deviation of mounted components, without narrowing the possible mounting region of components on the lead frame 31.

The width of the notch 37 or the hole 38 provided in the lead frame 31 as a solder flow suppressing section is determined by taking account of the processing accuracy and reliability, and is desirably equal to or greater than the thickness of the lead frame 31.

According to the second embodiment as described above, components are mounted by using a lead frame in which a positional deviation suppressing section formed by a notch or a hole is provided at a suitable position. By adopting a configuration of this kind, it is possible to broaden the possible component mounting region compared to the first embodiment described above. As a result of this, it is possible to improve the accuracy of the mounting positions of mounted components on the lead frame, and it is possible to obtain a semiconductor module which achieves higher mounting density and more compact size compared to the first embodiment.

Even if the projection shape 36 described in the first embodiment above is processed by a half-blanking process rather than using a notch 37 or hole 38 as the solder flow suppressing section, it is also possible to obtain a similar beneficial effect to when a notch 37 or hole 38 is formed.

Third Embodiment

The first and second embodiments above describe a structure in which the U-phase, V-phase and W-phase semiconductor modules are formed into individual modules. On the other hand, in the third embodiment, a case where, three semiconductor modules constituting an inverter 3 are formed into one module, is described.

Figure 8:
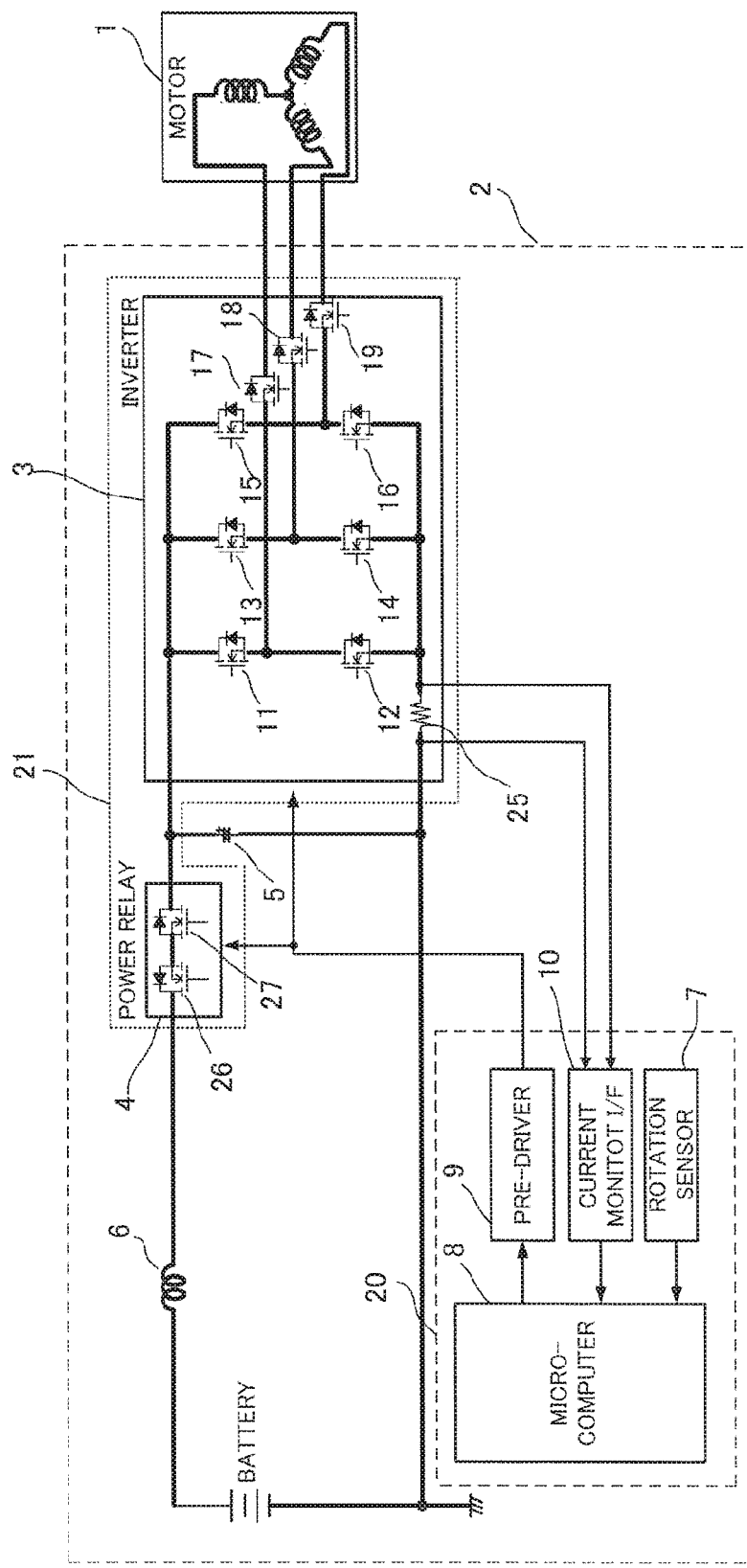
FIG. 8 is a general circuit diagram showing a power steering device mounted in a vehicle, as an example of a device to which the semiconductor module according to a third embodiment is applied.

FIG. 8 is a general circuit diagram showing a power steering device mounted in a vehicle, as an example of a device to which the semiconductor module according to the third embodiment is applied. Compared to FIG. 1 of the first embodiment described above, the configuration in FIG. 8 according to the third embodiment differs in that the number of shunt resistances (25) for current monitoring is changed from three to one, in accordance with the change of configuring the three semiconductor modules constituting the inverter 3 into one module.

Figure 9:
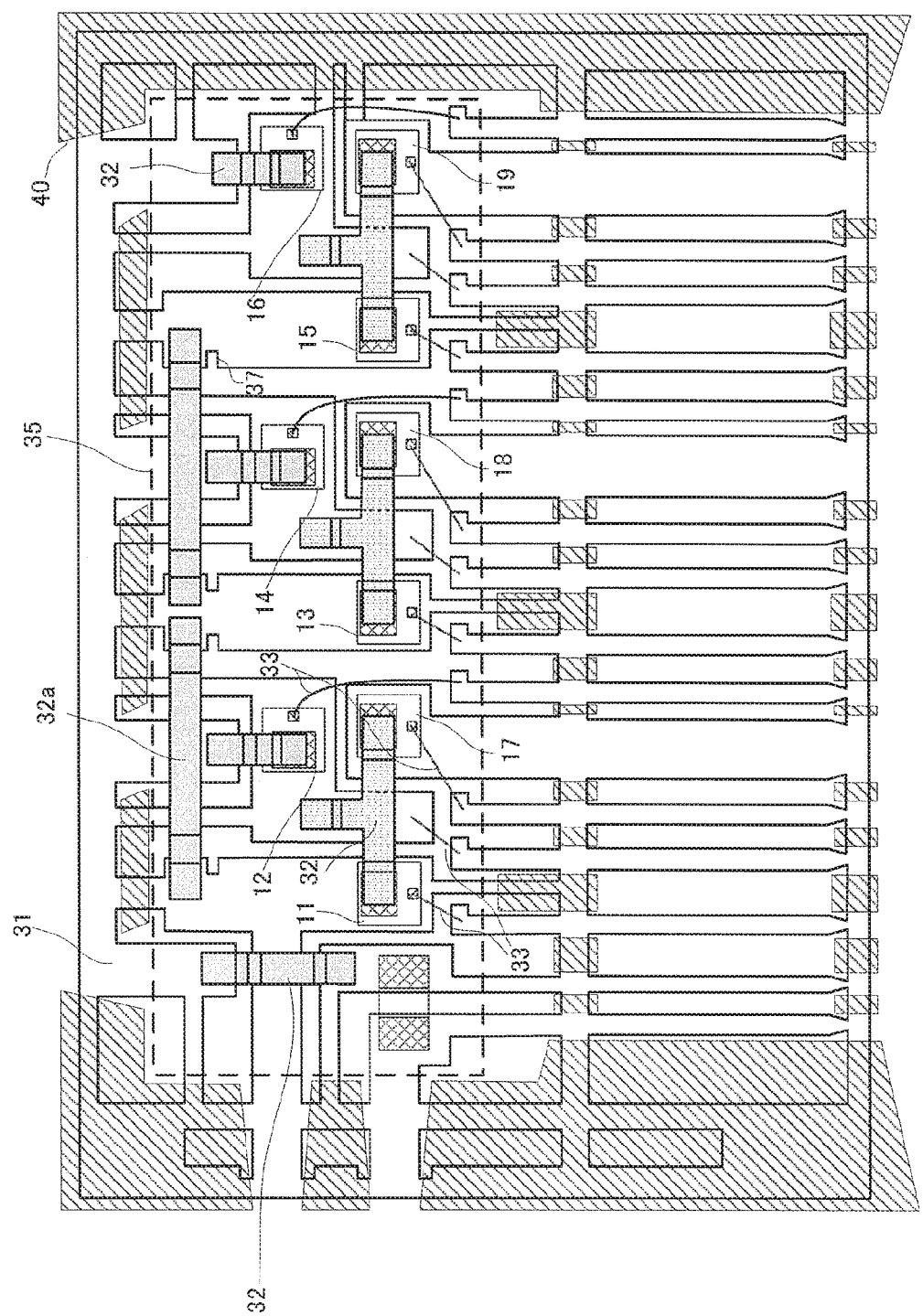
FIG. 9 is a perspective drawing of a half-completed state of a semiconductor module to which the solder flow suppressing section according to the third embodiment of the present invention has been applied.

Furthermore, FIG. 9 is a perspective drawing of a half-completed state of a semiconductor module to which the solder flow suppressing section according to the third embodiment of the present invention has been applied, and depicts an example in which three semiconductor modules are formed into one module, so as to correspond to FIG. 8. Therefore, the description below centers on the point of difference in forming into one module, with reference to FIG. 8 and FIG. 9, and description on constituent portions, which are the same as the semiconductor modules according to the first and second embodiments, are omitted here.

In the semiconductor module according to the third embodiment, all of the components constituting an inverter 3 are formed into one module. Consequently, the size of one module is increased, and the inner lead 32 also becomes larger, compared to when forming individual modules for each phase. In particular, the inner lead 32a which corresponds to the bus bar connecting the terminals of the same potential in each phase has a larger dimension in the lengthwise direction compared to other components. Therefore, when mounting on a lead frame 31, the amount of positional deviation when the component is rotated is greater and becomes an obstacle to compactification of the module.

Therefore, by applying the solder flow suppressing section of the present invention to the lead frame 31 which is used in the module that has become enlarged in this way, it is possible to suppress positional deviation effectively. FIG. 9 illustrates a case where a notch section 37 is used as a solder flow suppressing section. As a result of providing a solder flow suppressing section of this kind, it is possible to shorten the distance between components as a result of improving the mounting position accuracy, even if a large number of components are configured into one module, and it is possible to manufacture a semiconductor module having high density mounting of the components.

According to the third embodiment as described above, when a large number of components are configured as one module, components are mounted by using a lead frame in which a positional deviation suppressing section according to the present invention is provided at a suitable position. As a result of this, it is possible to improve the accuracy of the mounting positions of mounted components on the lead frame, whereby the distance between components can be shortened and it is possible to obtain a semiconductor module which achieves high mounting density and more compact size.

Fourth Embodiment

Figure 10:
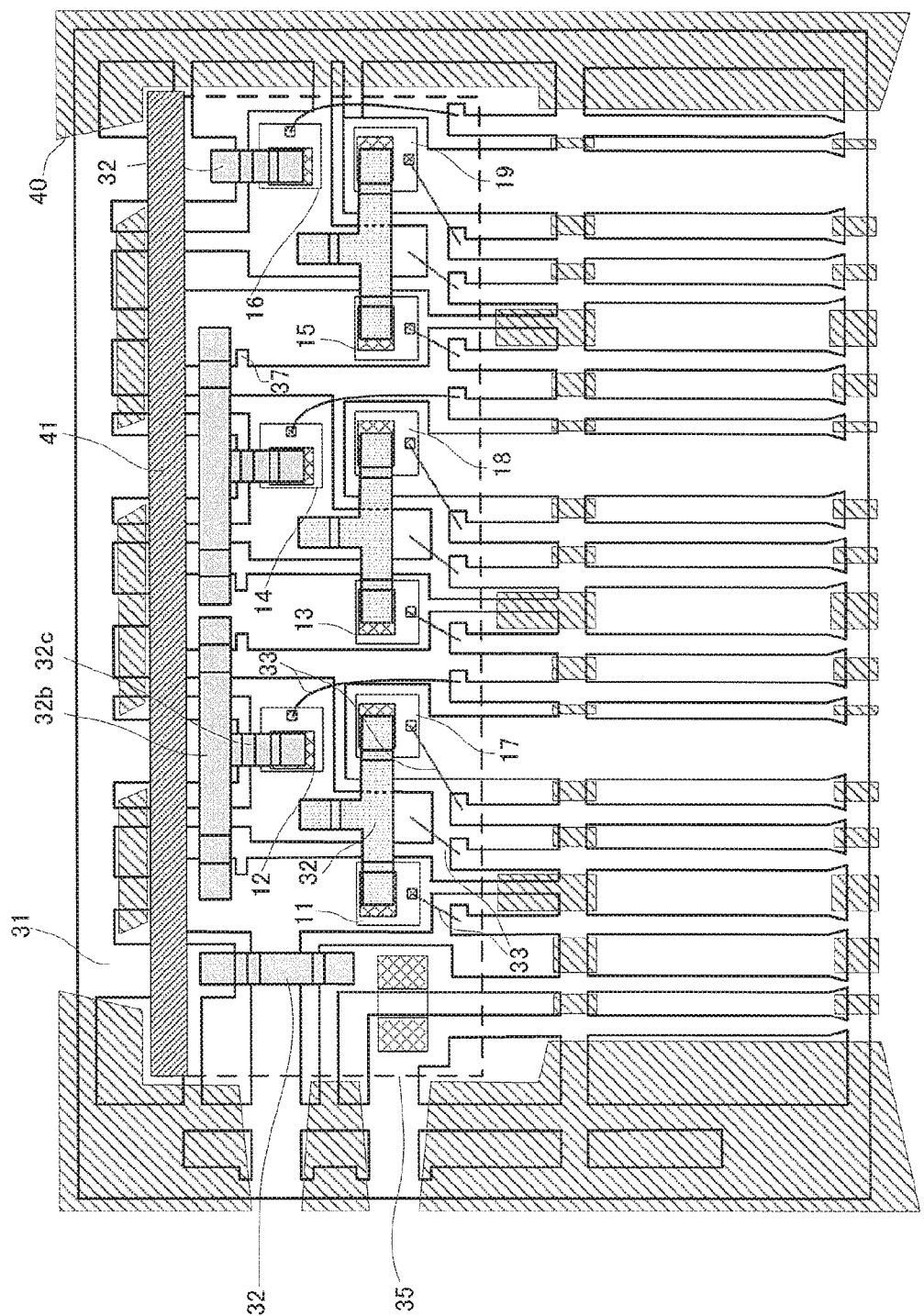
FIG. 10 is a perspective drawing of a half-completed state of a semiconductor module to which the solder flow suppressing section according to a fourth embodiment of the present invention has been applied.

The fourth embodiment describes a structure for achieving even higher density mounting, with respect to the structure of the third embodiment described above. FIG. 10 is a perspective drawing of a half-completed state of a semiconductor module to which the solder flow suppressing section according to the fourth embodiment of the present invention has been applied, and depicts an example in which three semiconductor modules are formed into one module, so as to correspond to FIG. 8 described above.

The semiconductor module according to the fourth embodiment, similarly to the third embodiment described above, has a structure in which all of the components constituting an inverter 3 are configured as one module. When compared with FIG. 9 relating to the third embodiment described above, the configuration in FIG. 10 relating to the fourth embodiment differs in that the inner lead 32*b* and the inner lead 32*c* intersect three-dimensionally. Therefore, the description below centers on this point of difference, with reference to FIG. 10, and description on constituent portions, which are the same as the semiconductor modules according to the first to third embodiments, are omitted here.

In the fourth embodiment, as shown in FIG. 10, the inner lead 32*b* and the inner lead 32*c* which correspond to bus bars of different potentials intersect three-dimensionally. In this way, by adopting a three-dimensionally intersecting structure in addition to the solder flow suppressing section of the present invention, it is possible to make the semiconductor module even more compact in size compared to the third embodiment described above. FIG. 10 illustrates a case where a notch section 37 is used as a solder flow suppressing section.

More specifically, in FIG. 10, it is possible to compress the portion of a second compressible region 41 which is indicated by the top-left to bottom-right hatching, thus contributing to further compactification of the semiconductor module.

Figure 11:
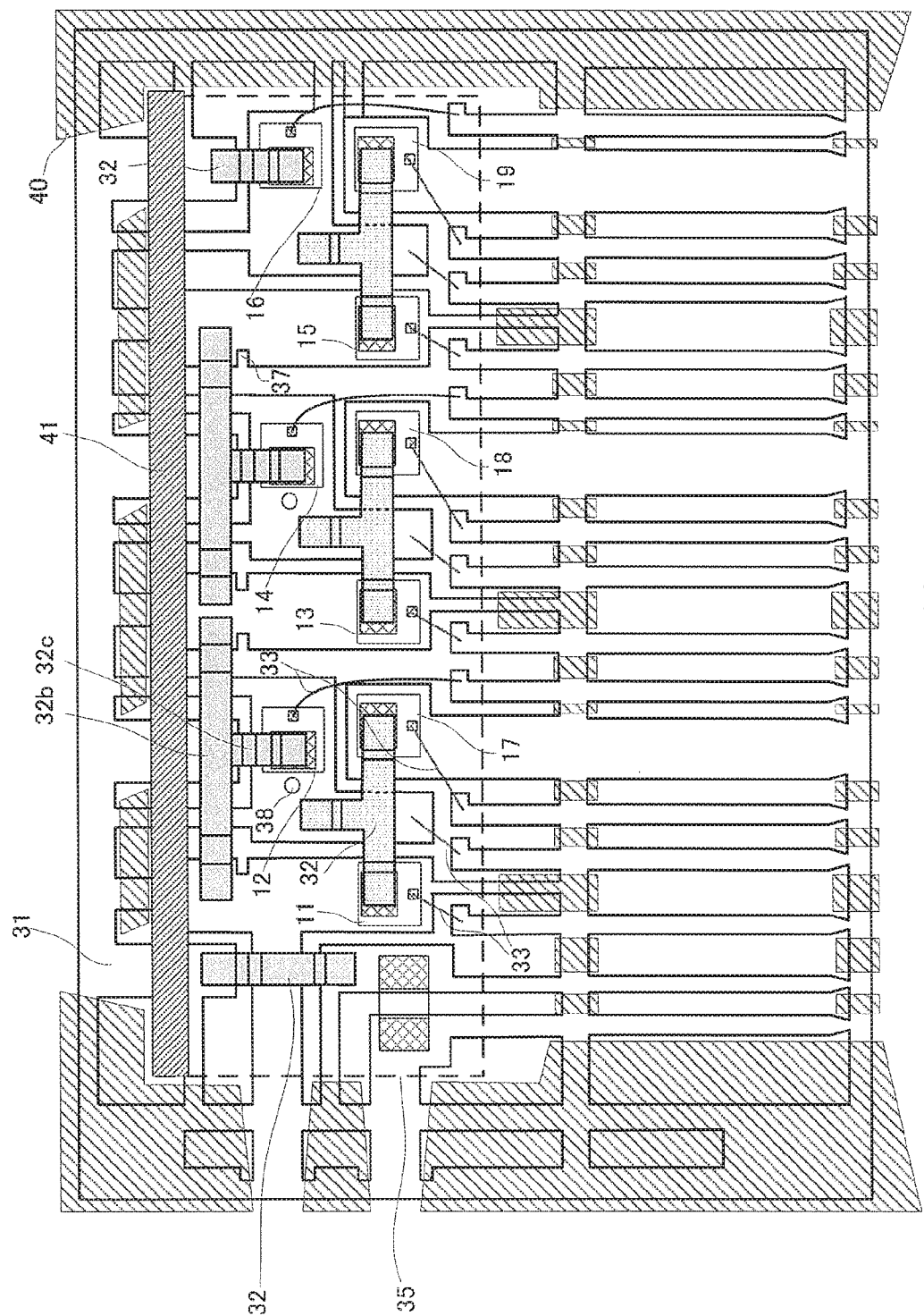
FIG. 11 is a perspective drawing of a half-completed state of a semiconductor module to which a solder flow suppressing section which is different to that in FIG. 10 according to the fourth embodiment of the present invention has been applied.

Next, FIG. 11 is a perspective drawing of a half-completed state of a semiconductor module to which a solder flow suppressing section which is different to that in FIG. 10 according to the fourth embodiment of the present invention has been applied. In FIG. 11, in addition to the configuration in FIG. 10 described above, a solder flow suppressing section based on a hole 38 is also provided in a U-phase lower-side FET and V-phase lower-side FET where the inner lead 32*c* are installed.

In this way, by forming the hole 38, it is possible to improve the mounting position accuracy of the FET, and it is possible to more reliably avoid shorting of the connection between the inner lead 32*b* and the inner lead 32*c*. As a result of this, when a large number of components is configured as one module, it is possible to make the semiconductor module more compact, as well as ensuring reliability of the product.

According to the fourth embodiment as described above, when a large number of components are configured as one module, components are mounted by using a lead frame in which a positional deviation suppressing section according to the present invention is provided at a suitable position, as well as adopting a three-dimensional intersecting structure. As a result of this, it is possible to improve the accuracy of the mounting positions of mounted components on the lead frame, whereby the distance between components can be shortened and it is possible to obtain a semiconductor module which enables high mounting density and more compact size.

The invention claimed is:

1. A semiconductor module comprising:
    a lead frame comprising a plurality of terminals;
    an electronic component;
    a bus bar,
    wherein the electronic component and the bus bar are mounted and soldered onto the lead frame; and
    a solder flow suppressing section capable of restricting a direction of flow of solder on the lead frame, and disposed in the lead frame in a vicinity of a solder portion of the electronic component mounted by solder thereon,
    wherein the solder flow suppressing section comprises a notch in the lead frame or a hole through the lead frame, in at least one portion of a region along the solder portion.

2. The semiconductor module according to claim 1, wherein the solder flow suppressing section comprises an uneven shape in the at least one portion of the region along the solder portion.

3. The semiconductor module according to claim 2, wherein the uneven shape is provided in a whole region along the solder portion on the lead frame.

4. The semiconductor module according to claim 1, wherein the notch or the hole is provided in a whole region along the solder portion on the lead frame.

5. The semiconductor module according to claim 1, wherein a width of the notch or the hole provided in the lead frame as the solder flow suppressing section is equal to or greater than a thickness of the lead frame.

6. The semiconductor module according to claim 2, wherein the uneven shape provided in the lead frame as the solder flow suppressing section is formed by processing of a half-blanking step.

7. The semiconductor module according to claim 1, wherein the solder flow suppressing section is provided in the lead frame in at least one portion in a vicinity of a solder portion on the bus bar that connects terminals of a same potential.

8. The semiconductor module according to claim 7, wherein the solder flow suppressing section is provided in the lead frame in a vicinity of solder portions at both ends of the bus bar.

9. The semiconductor module according to claim 1, wherein the solder flow suppressing section is provided in the lead frame in a vicinity of a solder portion of two bus bars that connect together electronic components that are mounted by solder, or the plurality of terminals of the lead frame, or the electronic component and the plurality of terminals, with the two bus bars intersecting three-dimensionally at different potentials.

10. The semiconductor module according to claim 1, wherein the solder flow suppressing section is provided in the lead frame in the vicinity of the solder portion of the electronic component disposed directly below the bus bar that connects together electronic components that are mounted by solder, or the plurality of terminals of the lead frame, or the electronic component and the plurality of terminals, with the electronic component intersecting three-dimensionally with the bus bar.

11. A semiconductor module comprising:
a lead frame comprising a plurality of terminals;
an electronic component;
a bus bar,
wherein the electronic component and the bus bar are mounted and soldered onto the lead frame; and
a solder flow suppressing section capable of restricting a direction of flow of solder on the lead frame, and disposed on the lead frame in a vicinity of a solder portion of the electronic component mounted by solder thereon,
wherein, when a semiconductor provided with a plurality of switching elements that drive a multiple-phase inverter device having three or more phases is configured as a module, the module comprises the lead frame, in which the solder flow suppressing section is disposed, individually for each phase of the multiple-phase inverter device.

12. A semiconductor module comprising:
a lead frame comprising a plurality of terminals;
an electronic component;
a bus bar,
wherein the electronic component and the bus bar are mounted and soldered onto the lead frame; and
a solder flow suppressing section capable of restricting a direction of flow of solder on the lead frame, and disposed on the lead frame in a vicinity of a solder portion of the electronic component mounted by solder thereon,
wherein, when a semiconductor provided with a plurality of switching elements that drive a multiple-phase inverter device having three or more phases is configured as a module, the module comprises the lead frame, in which the solder flow suppressing section is disposed, for each two phases or each three phases of the multiple-phase inverter device.

13. The semiconductor module according to claim 12, wherein the solder flow suppressing section is provided in a vicinity of a solder portion of the bus bar that connects together terminals of a same potential between different phases.

14. The semiconductor module according to claim 4, wherein a width of the notch or the hole provided in the lead frame as the solder flow suppressing section is equal to or greater than a thickness of the lead frame.

15. The semiconductor module according to claim 3, wherein the uneven shape provided in the lead frame as the solder flow suppressing section is formed by processing of a half-blanking step.

16. The semiconductor module according to claim 2, wherein the solder flow suppressing section is provided in the lead frame in at least one portion in a vicinity of a solder portion on the bus bar that connects terminals of a same potential.

17. The semiconductor module according to claim 1, wherein the solder flow suppressing section is provided in the lead frame in at least one portion in a vicinity of a solder portion on the bus bar that connects terminals of a same potential.

18. The semiconductor module according to claim 16, wherein the solder flow suppressing section is provided in the lead frame in a vicinity of solder portions at both ends of the bus bar.

19. The semiconductor module according to claim 17, wherein the solder flow suppressing section is provided in the lead frame in a vicinity of solder portions at both ends of the bus bar.

* * * * *